OSCILLATOR FREQUENCY DRIFT COMPENSATION ARRANGEMENT

Filed April 9, 1956

INVENTOR.
OLE K. NILSSEN
BY F. A. Rechif
ATTORNEY

United States Patent Office 2,811,647

Patented Oct. 29, 1957

2,811,647

OSCILLATOR FREQUENCY DRIFT COMPENSATION ARRANGEMENT

Ole K. Nilssen, Collingswood, N. J., assignor to Radio Corporation of America, a corporation of Delaware Application April 9, 1956, Serial No. 577,074

15 Claims. (Cl. 250—36)

This invention relates to frequency drift compensation or prevention arrangements for oscillators, and more particularly to arrangements for compensating for or preventing the frequency drift of local oscillators in television (TV) receivers, either of the monochrome or color type. The invention is particularly useful for receivers operating in the very-high-frequency (V. H. F.) and ultra-high-frequency (U. H. F.) TV bands, but it is useful also at lower frequencies.

During the "warm-up period" of the local oscillator in a TV receiver, heat flows are taking place inside as well as outside the oscillator tube by radiation and conduction from the "hot bodies" such as the cathode and anode, and from all other heat sources in the TV receiver. Initially, the grid intercepts heat from both the cathode and anode, though it may eventually reach a temperature even higher than the anode temperature in certain types of tubes. The flow of heat in various forms and directions unavoidably changes the tube constants (e. g., the interelectrode capacitances) and circuit constants and consequently also the oscillator frequency. This change or drift in the oscillator frequency, from the frequency value of the local oscillator when the receiver first attains operable conditions to the frequency value when the local oscillator becomes substantially stabilized, may be as much as one megacycle, or even more.

With the advent of color TV at V. H. F. and U. H. F., the requirement for local oscillator stability cannot easily be met by the conventional method of frequency drift compensation or drift prevention. For color TV, to prevent noticeable degradation of the picture the local oscillator should be held within about 100 kc. (kilocycles) of its correct frequency, and it is very difficult for the conventional method of drift compensation or prevention to compensate for drifts of the order of one megacycle, and to fulfill the requirement of reduction of drift to 100 kc. or less. The problem is even worse at U. H. F. than at V. H. F., since in general the oscillator frequency drift is approximately directly proportional to the local oscillator frequency.

The stated requirement for local oscillator stability, together with the inherent (and unavoidable) large frequency drift of the local oscillator, makes it necessary to use some form of frequency control, frequency stabilization, or frequency compensation. At the present time, automatic frequency control (A. F. C.) of the local oscillator seems impractical, for several reasons, and the next best thing is then a good frequency drift compensation or drift prevention of the local oscillator. Also, even if A. F. C. of the local oscillator were practical, frequency drift compensation is required since the inherent frequency drift of the oscillator due to heating up, etc. is beyond the pull-in range of any known A. F. C. systems.

An object of this invention is to devise a novel frequency drift compensation or drift prevention arrangement for oscillators.

Another object is to provide a simple yet effective voltage-responsive frequency controlling element for oscillators, together with circuitry for causing this element to produce a drift-compensating effect in the oscillator.

The objects of this invention are accomplished, briefly, in the following manner: A voltage-responsive capacitor (e. g., a junction diode which provides capacitance) is connected into the frequency-determining circuit of the oscillator the frequency drift of which is to be compensated, and a time-constant circuit is arranged to apply a time-dependent voltage to this capacitor, beginning at the time the oscillator becomes operative, in such a way as to cause the oscillator frequency change produced by this capacitor to oppose the frequency drift of the oscillator, thus effectively preventing any frequency drift of the oscillator.

A detailed description of the invention follows, taken in conjunction with the accompanying drawing, wherein.

Figure 1:
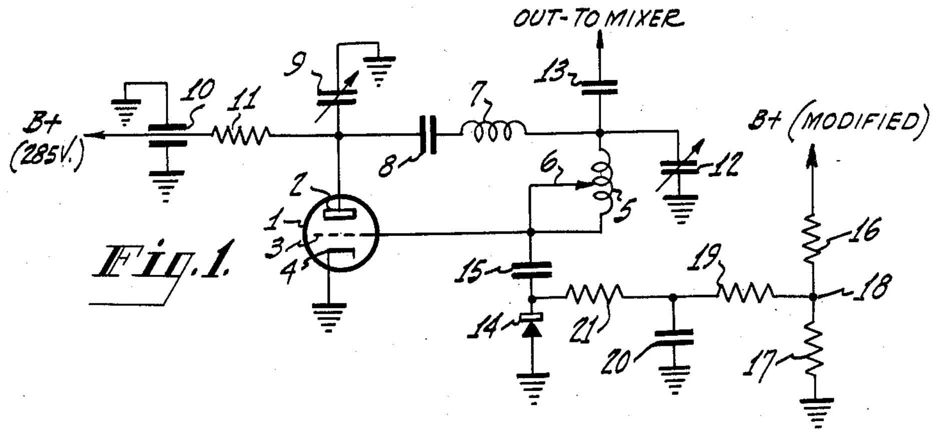
Fig. 1 is a diagram of an oscillator circuit utilizing this invention.

Referring first to Fig 1, an oscillator circuit utilizing this invention is shown. An evacuated electron discharge structure 1 includes an anode 2, a grid 3, and a cathode 4. Cathode 4 is grounded, while grid 3 is connected to one end of an inductor 5 which is made variable by means of a tap 6 thereon which tap is also connected to the grid end of this inductor. The other end of inductor 5 is connected through another inductor 7 and a capacitor 8 to anode 2. A variable (trimmer) capacitor 9 is connected from anode 2 to ground, while positive anode potential is supplied from the positive terminal B+ of a source of unidirectional potential, by way of a feed-through capacitor 10 and through a resistor 11, to anode 2. A variable (fine tuning) capacitor 12 is connected from the junction of inductor 5 and inductor 7 to ground. Oscillatory energy for injection purposes is taken off from the common junction of elements 5 and 7 and fed through a coupling capacitor 13 to a mixer (not shown). The circuit so far described is of a type which is rather widely used for the local oscillator in TV receivers.

Figures 2, 3, 4:
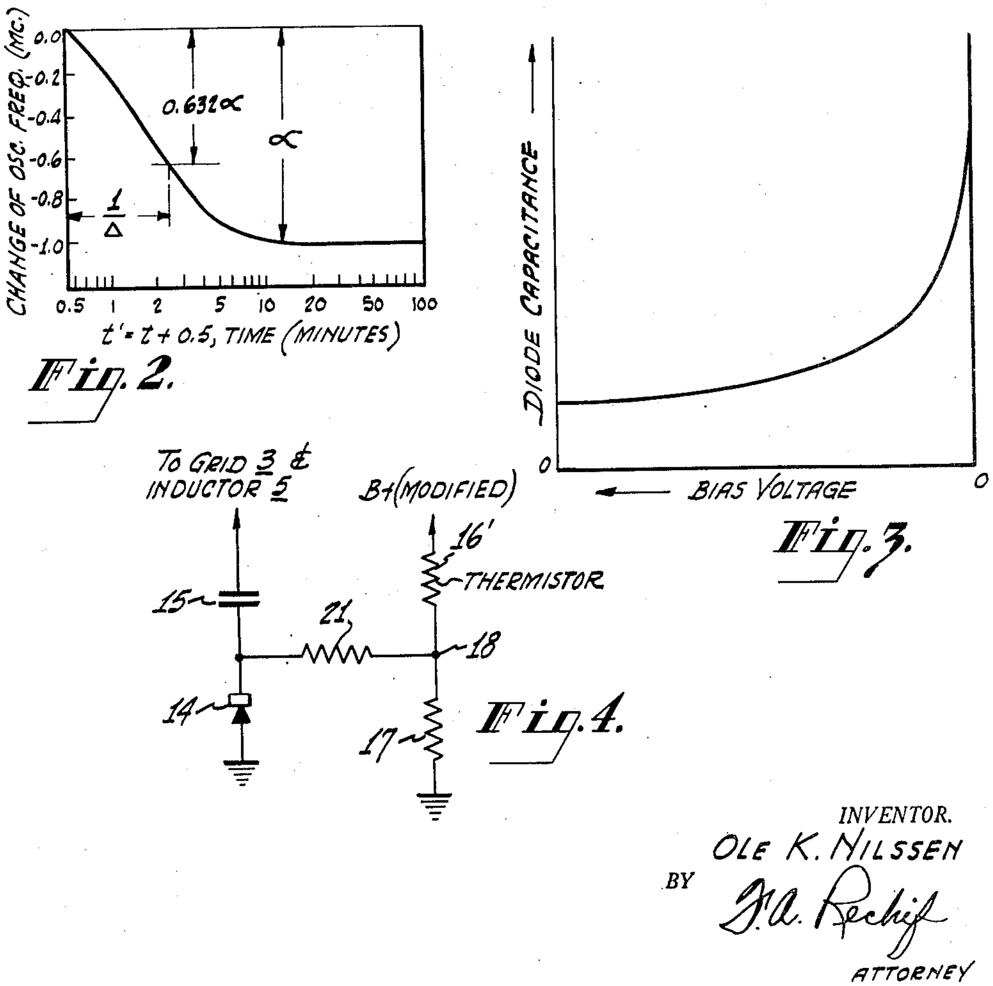
Figs. 2 and 3 are curves useful in explaining the invention.
Fig. 4 is a partial circuit diagram of a modification of Fig. 1.

Fig. 2 is a typical frequency drift characteristic for the local oscillator of a TV receiver, such as that of Fig. 1. This is an oscillator frequency drift curve, in which the change of oscillator frequency is plotted against time in minutes. For this curve, the oscillator frequency at exactly 0.5 minute after the oscillator tube is energized is taken as "reference." Any deviation from this reference frequency is defined as "frequency drift." The 0.5-minute delay in establishing the oscillator reference frequency is to enable the TV receiver to attain operable conditions, such as full voltage output of the receiver B+ power supply, etc.

The Fig. 2 curve is approximately of the exponential form defined by the equation $$\Delta F = \alpha(1 - e^{-\Delta\ t})$$

where ΔF is the instantaneous change of the oscillator frequency from the reference frequency in mc., $\alpha$ is the maximum frequency deviation from the reference frequency in mc. (the drift when the oscillator becomes substantially stabilized or when the "short-time" frequency drift is over), $e$ is the base of natural logarithms, and Δ is a constant determining the rate of change of oscillator frequency with respect to time, $t$, in minutes.

From Fig. 2, it may be observed that the frequency of the oscillator decreases with time, indicating that the tube capacitances and circuit capacitances exhibit a positive temperature coefficient, since the temperature of these capacitances increases with time and increasing capacitance results in decreasing oscillator frequency.

In other words, the tube capacitances and circuit capacitances increase with time, resulting in oscillator frequency drift in a downward or decreasing direction. The oscillator characteristic in Fig. 2 indicates that the oscillator frequency becomes substantially stabilized (at which time the "short-time" or "short-term" drift of the oscillator is over) after about 20 minutes. According to the above equation, the constants $\alpha$ and $\Delta$ can fully describe the drift characteristics of the oscillator. However, the magnitudes of these constants may vary with local oscillators and different operating conditions. For example, the constant $\alpha$ varies approximately directly with oscillator frequency. As another example, the constant $\alpha$ varies with oscillator tube heater power.

According to this invention, frequency drift compensation or drift prevention is effected by utilizing a compensating capacitor coupled to the frequency-determining circuit of the oscillator, this capacitor being constructed and arranged and connected in a circuit to provide an oscillator frequency change which varies substantially exponentially with time, and approximately inversely to the curve in Fig. 2. Further according to this invention, a voltage-responsive or voltage-sensitive capacitor is utilized, and a time-constant circuit is provided to vary the voltage applied to this capacitor (and thus to vary the capacitance thereof) exponentially with time. Since the various capacitances which provide the drift curve of Fig. 2 increase with time, what is needed is a compensating arrangement which provides a decreasing capacitance with time.

Referring again to Fig. 1, which shows a preferred embodiment of the invention, the anode of a diode 14 is connected to ground and the cathode of this diode is connected through a capacitor 15 to grid 3 of the oscillator tube 1. Diode 14 is of a particular type, to be described in more detail hereinafter, and provides a capacitance between its electrodes which is capable of variation in response to variations in the reverse bias applied thereto. Thus, diode 14 serves as the voltage-sensitive capacitor which is required. The diode 14 is coupled to the frequency-determining circuit of the oscillator in the following way. Between the grid 3 and anode 2 the following path may be traced: capacitor 15, the capacitance of diode 14, ground, capacitor 9. Also, another path may be traced as follows from grid 3 to anode 2: inductor 5, choke 7, capacitor 8. A third path is of course by way of the direct interelectrode capacitance between grid 3 and anode 2. These paths together, as well as others, make up the frequency-determining circuit of the oscillator, and the capacitance of diode 14 is thus coupled to the frequency-determining circuit of the oscillator, so that variations in the capacitance afforded by diode 14 may affect the frequency of the oscillator.

A time-constant circuit is arranged to supply a voltage which varies exponentially with time to diode 14, to vary the capacitance afforded thereby in the same fashion. This voltage provides a reverse bias for the diode, that is, a bias in the non-conduction direction, and for convenience the circuit may be arranged so that a voltage which varies from about zero volts to four volts positive (or whatever voltage is required to give compensation) over a certain time interval which begins shortly after the TV receiver is energized, is applied to the cathode of diode 14. A voltage divider arrangement consisting of two resistors 16 and 17 connected in series, is connected from the positive terminal B+ of a unidirectional potential source to ground. This source may be a modified B+ supply, as indicated. The unidirectional potential source which is used here may or may not be the same potential source that is used for the anode supply of oscillator tube 1, but in any event, positive potential is applied to both terminals marked B+ in Fig. 1 when, and only when, the TV receiver is turned on. The modified B supply may alternatively be negative (if the diode 14 is reversed so that a reverse bias is applied to the diode). A resistance-capacitance (RC) time-constant circuit, consisting of a resistor 19 and a capacitor 20 connected in series in that order, is connected from the junction point 18 of resistors 16 and 17 to ground. Thus, the positive voltage available at point 18 is used to charge capacitor 20 through resistor 19 when the TV receiver is turned on and the oscillator tube 1 energized. The voltage across capacitor 20 may be made to increase exponentially (due to the charging of this capacitor) from zero volts to say about four volts positive (or whatever voltage is required) over a time interval beginning when the B+ terminal to which the upper end of resistor 16 is connected, is energized. This time interval is uniquely determined by the time-constant of the RC network 19, 20.

A resistor 21 is connected from the junction point of resistor 19 and capacitor 20 to the cathode of diode 14. In this way, a certain portion of the exponentially-increasing positive voltage across capacitor 20 is applied to the cathode of diode 14, a positive bias on the diode cathode being a bias in the reverse or non-conduction direction. Component 21 (which may be either a resistor, as shown, or a choke) serves to isolate the RC circuit 19, 20 from the oscillator circuit, from an R. F. standpoint. At the same time, the resistor 21 should have a value, taking into consideration the current flowing through this resistor because of the "leakage" current (reverse current) flowing through diode 14, such as to provide the proper final or end voltage on the cathode of diode 14, that is, a final or end voltage which will produce, through its effect on the capacitance afforded by diode 14, a proper final compensation for the final drift $\alpha$ (Fig. 2). Also, the RC time constant of network 19, 20 should be such that, taking into consideration the voltage-capacitance characteristic of diode 14, the compensation effected will be substantially similar and in the opposite direction to the drift curve in Fig. 2. To make a closer approximation to complete and full compensation, a combination of several RC networks could be used, if desired, to provide the desired time constant for the diode reverse bias voltage.

According to this invention, the diode 14 is preferably a junction diode, that is, a junction of two dissimilar semiconductors. For example, the diode may consist of an 0.015-inch diameter×0.015-inch long cylinder of indium alloyed onto an 0.002-inch thick×0.070-inch diameter wafer of 0.1 ohm-cm.-type germanium and mounted with low inductance connections. Such a junction diode has a variety of electrical properties. If the diode is biased in the reverse (non-conduction) direction, the mobile charge carriers are moved away from the junction, leaving uncompensated fixed charges in a region near the junction. The width, and hence the electrical charge of this region (space-charge layer), depends on the applied voltage, giving rise to a junction transition capacitance. The junction diode transition capacitance is inversely proportional to the effective width of the junction, and since the effective junction width is voltage dependent, the capacitance afforded by the junction diode is voltage dependent. In other words, a semiconductor junction when biased in the reverse or non-conduction direction is a capacitance which can be varied by varying the bias voltage.

The capacitance-vs.-reverse bias voltage characteristic of a junction diode such as diode 14 has the shape illustrated in Fig. 3, from which it may be seen that the capacitance afforded by the diode varies inversely with the reverse bias voltage, and specifically, inversely as approximately the square root of the bias voltage for a particular diode of the construction previously described. That is, as the bias voltage increases in the non-conduction direction the capacitance decreases. Since, as previously stated, what is needed for oscillator frequency drift compensation or drift prevention is an arrangement which provides a decreasing capacitance (tending to increase the oscillator frequency) with time, and since the capacitance afforded by the junction diode 14 decreases as the reverse bias increases, the application to the junction diode of a reverse bias which increases with time will provide the desired oscillator frequency drift compensation, when the junction diode transition capacitance is connected into the frequency determining circuit of the oscillator. The circuit arrangement including components 16—20, as previously described, provides a positive bias voltage which increases with time from the energization of the receiver power supply, and this positive voltage is applied as a reverse bias to diode 14 since it is applied to the cathode thereof. Therefore, compensation for the oscillator frequency drift illustrated in Fig. 2 is effected by employing the voltage-sensitive capacitor (junction diode) 14, and using a time-constant circuit to apply a reverse bias voltage to this capacitor. In Fig. 1, the time-constant circuit is an RC circuit. As previously stated, the oscillator frequency change with time which would be produced as a result of the changing voltage acting on the voltage-sensitive capacitor (junction diode) 14 is made to match (but in the opposite direction) the oscillator frequency drift curve of Fig. 2. Thus, very good oscillator frequency drift compensation is effected, for "short-time" frequency drift. That is, "short-time" frequency drift is effectively prevented. When matching the curves as aforesaid, consideration must be given to the exponential shape of the voltage (across capacitor 20)-vs.-time curve, and to the shape of the bias voltage-vs.-capacitance (of the junction diode 14) curve of Fig. 3. It will be recalled, in in this connection, that the B+ sources for the network 19, 20 and for the oscillator tube 1 are energized substantially simultaneously, when the TV receiver is turned on.

In a practical arrangement which was built according to this invention and successfully tested, certain of the circuit constants were as follows: tube 1, 6AF4A; resistor 11, 12000 ohms; capacitor 8, 10 mmfd.; capacitor 15, 18 mmfd.; diode 14 capacitance, varies between 40 mmfd. and 10 mmfd. as the reverse bias varies from zero volts to about four volts positive.

Other locations in the oscillator circuit of the voltage-sensitive capacitor (junction diode) 14 are possible, though the location in Fig. 1 (in the grid circuit) is preferred because the greatest sensitivity is obtained when the diode 14 is in this location. An alternative location of the junction diode 14 would be between the grounded side of capacitor 9 and ground.

It is possible according to this invention to use other types of time-constant circuits (instead of the RC network 19, 20 of Fig. 1) to provide the time-dependent reverse bias voltage for the junction diode 14. One type of time-constant circuit which may be utilized is disclosed in Fig. 4, to which reference will now be made. In this modification, resistor 19 and capacitor 20 are eliminated and resistor 16 is replaced by a so-called thermistor 16', which is a mass of resistive material having a high negative temperature coefficient of resistivity. In Fig. 4, resistor 21 is connected directly between point 18 and the cathode of junction diode 14. The operation of Fig. 4 may be explained in the following way. As in Fig. 1, the modified B+ power supply (to which the upper end of resistor 16' is connected) is energized substantially simultaneously with the B+ power supply to which the anode 2 of oscillator tube 1 is connected. As current begins flowing through the voltage divider network 16', 17 (which is connected across the modified B+ supply), thermistor 16' starts to heat up at a certain rate due to the $I^2R$ losses in it, and as its temperature rises its resistance begins to decrease. This change (decrease) of resistance may be made to extend over a period of time sufficient to match the "short-time" drift period depicted in Fig. 2, by suitable design of the thermal mass, resistance, etc. of thermistor 16'. The decrease in the resistance of component 16' with time causes the voltage at point 18 to increase with time from zero volts (before energization of the modified B+ power supply) to a positive voltage, and the voltage at point 18 is in effect the reverse bias which is applied to the junction diode 14, to vary the capacitance afforded thereby as the reverse bias varies. Since the resistance of component 16' decreases with time, the voltage at point 18 rises or increases positively with time, thus providing the required time-dependent voltage for application to junction diode 14 to compensate or prevent the "short-time" oscillator frequency drift. In other words, the thermistor 16' in combination with resistor 17 provides the time-constant circuit which is required to develop a time-dependent voltage, for application to diode 14 to compensate or prevent the "short-time" frequency drift of the oscillator.

The arrangement of Fig. 4, using a thermistor time-constant circuit instead of an RC time-constant circuit, has an advantage over Fig. 1, in that the former may be arranged to compensate for or prevent the so-called "long-term" or "long-time" frequency drift, as well as the "short-time" drift.

In addition to the "short-time" drift of the oscillator previously referred to in connection with Fig. 2, which is compensated or prevented by both the Fig. 1 and Fig. 4 arrangements in the manner previously described, the local oscillator in a TV receiver is subject to a "long-term" frequency drift. This "long-term" drift may extend over a period of one to two hours, at the end of which time the oscillator may be as much as 500 kc. or even more below its correct frequency. This "long-time" drift results from relatively very slow changes in the ambient temperature around the oscillator circuit components, caused by the normal slow heating-up of such items as the power transformer and the chassis of the receiver, and also by the spacing between some of these items and the oscillator circuit components. The Fig. 2 drift curve is for an oscillator subjected only to constant ambient temperature, and therefore does not indicate any "long-time" drift (which results from changing ambient temperature in the TV receiver). The Fig. 2 curve illustrates only the "short-time" drift, and is therefore horizontal after the so-called "stabilized" frequency value is reached, at a time approximately represented by the location of the value $\alpha$ in this figure. To illustrate "long-time" drift, the curve in Fig. 2 should extend in the downward direction, even after the time (approximately ten to twenty minutes) at which it now levels off.

According to this invention, the thermistor 16' of Fig. 4 may be placed so that the same is thermally connected to the TV receiver chassis, or is otherwise exposed to the ambient temperature in the TV receiver. Then, the thermistor will be heated as the chassis and other large components slowly heat up, that is, as the ambient temperature in the TV receiver changes. The thermistor will be heated directly in response to the heating up of these large components. The "short-time" temperature-vs.-time curve of the thermistor (with a constant receiver ambient temperature and due only to $I^2R$ losses in the thermistor itself, and previously described) may be approximately the inverse of the Fig. 2 curve. The curve representing the variation of receiver ambient temperature with time may slope continuously upwardly, more or less linearly, over a quite long period of time. Since the thermistor is subjected to the TV receiver ambient temperature, it will have a "long-time" rise of temperature with time which will be superimposed on the "short-time" rise (which latter is the approximate inverse of Fig. 2, as previously stated). Thus, the resultant temperature-vs.-time curve of the thermistor will have a rather steep upward slope at first, for a "short time," after which (and for a "long time") its slope will not be quite as steep but will still be in the upward direction.

The "long-term" effect of the thermistor is quite analogous to its "short-term" effect, previously described. The "long-term" heating of the thermistor causes its resistance to decrease, bringing about a slow increase in the voltage at point 18. This slow increase in the voltage at point 18 causes the reverse bias applied to diode 14 to slowly increase and the diode capacitance to slowly decrease. This decrease in capacitance is of the proper direction to compensate for or prevent the "long-term" downward drift of the oscillator frequency normally resulting from the "long-time" change of receiver ambient temperature.

By suitable design, the resultant temperature-vs.-time curve of the thermistor may be made such that the voltage applied to the capacitance provided by diode 14 varies in such a way as to give complete compensation for or prevention of both the "short-time" and "long-time" frequency drift of the oscillator. Thus, the thermistor arrangement of Fig. 4 can be made to compensate for or prevent both the "long-term" and short-term" oscillator frequency drift, while the RC arrangement of Fig. 1 will compensate for or prevent only the short-term oscillator frequency drift.

In Fig. 4, and also in Fig. 1, the resistor 21 may be replaced by a choke, if desired.

What is claimed is:

1. In combination, an oscillator whose frequency tends to drift with time beginning at the instant when said oscillator first becomes operative, a two-electrode capacitor whose capacitance varies in response to variations in the unidirectional bias voltage applied thereto, means coupling the two electrodes of said capacitor to the frequency-determining circuit of said oscillator, and means for applying a unidirectional bias voltage to said capacitor which varies with time beginning at said instant, thereby to vary the capacitance of said capacitor as a function solely of time in such a direction as to oppose said frequency drift.

2. In combination, an oscillator whose frequency tends to decrease with time beginning at the instant when said oscillator first becomes operative, a two-electrode capacitor whose capacitance decreases in response to an increase in the unidirectional bias voltage applied thereto, means coupling the two electrodes of said capacitor to the frequency-determining circuit of said oscillator, and means for applying a unidirectional bias voltage to said capacitor which increases with time beginning at said instant, thereby to decrease the capacitance of said capacitor as a function solely of time, so as to tend to increase the oscillator frequency with time.

3. In combination, an oscillator whose frequency tends to drift with time beginning at the instant when said oscillator first becomes operative, a junction diode coupled to the frequency-determining circuit of said oscillator, the capacitance afforded by said diode varying in response to variations in the reverse bias applied thereto, and means effective at said instant for applying a time-dependent reverse bias to said diode, thereby to vary said capacitance with time in such a direction as to oppose said frequency drift.

4. The combination set forth in claim 3, wherein the junction diode comprises a germanium-indium junction.

5. In combination, an oscillator whose frequency tends to drift with time according to a predictable curve, beginning at the instant when said oscillator first becomes operative, a junction diode coupled to the frequency-determining circuit of said oscillator, the capacitance afforded by said diode varying in response to variations in the reverse bias applied thereto, and means effective at said instant for applying a time-dependent reverse bias to said diode such as to tend to cause an oscillator frequency change opposite to said drift curve.

6. In combination, an oscillator whose frequency tends to decrease with time beginning at the instant when said oscillator first becomes operative, a junction diode coupled to the frequency-determining circuit of said oscillator, the capacitance afforded by said diode decreasing in response to an increase in the reverse bias applied thereto, and means effective at said instant for applying a time-dependent increasing reverse bias to said diode, thereby to decrease said capacitance and to tend to increase the oscillator frequency with time.

7. In combination, an oscillator whose frequency tends to drift when the same is first rendered operative, a junction diode coupled to the frequency-determining circuit of said oscillator, the capacitance afforded by said diode varying in response to variations in the reverse bias applied thereto, a time-constant circuit connecting said diode to a source of voltage, and means for rendering operative said oscillator and for simultaneously rendering operative said voltage source.

8. The combination set forth in claim 7, wherein the junction diode comprises a germanium-indium junction.

9. In combination, an oscillator whose frequency tends to drift when the same is first rendered operative, a junction diode coupled to the frequency-determining circuit of said oscillator, the capacitance afforded by said diode varying in response to variations in the reverse bias applied thereto, a resistance-capacitance time-constant circuit connecting said diode to a source of voltage, and means for rendering operative said oscillator and for simultaneously rendering operative said voltage source.

10. In combination, an oscillator whose frequency tends to drift when the same is first rendered operative, a junction diode coupled to the frequency-determining circuit of said oscillator, the capacitance afforded by said diode varying in response to variations in the reverse bias applied thereto, a resistor having a substantial temperature coefficient of resistivity connecting said diode to a source of voltage, and means for rendering operative said oscillator and for simultaneously rendering operative said voltage source.

11. In combination, an oscillator whose frequency tends to drift downwardly when the same is first rendered operative, a junction diode coupled to the frequency-determining circuit of said oscillator, the capacitance afforded by said diode decreasing in response to an increase in the reverse bias applied thereto, a time-constant circuit connecting said diode to a source of voltage, and means for rendering operative said oscillator and for simultaneously rendering operative said voltage source, thereby to apply a time-dependent increasing reverse bias to said diode.

12. In combination, an oscillator whose frequency tends to drift downwardly when the same is first rendered operative, a junction diode coupled to the frequency-determining circuit of said oscillator, the capacitance afforded by said diode decreasing in response to an increase in the reverse bias applied thereto, a resistance-capacitance time-constant circuit connecting said diode to a source of voltage, and means for rendering operative said oscillator and for simultaneously rendering operative said voltage source, thereby to apply a time-dependent increasing reverse bias to said diode.

13. In combination, an oscillator whose frequency tends to drift downwardly when the same is first rendered operative, a junction diode coupled to the frequency-determining circuit of said oscillator, the capacitance afforded by said diode decreasing in response to an increase in the reverse bias applied thereto, a resistor having a substantial temperature coefficient of resistivity connecting said diode to a source of voltage, and means for rendering operative said oscillator and for simultaneously rendering operative said voltage source, thereby to apply a time-dependent increasing reverse bias to said diode.

14. In combination, an oscillator whose frequency tends to drift with time when said oscillator is first rendered operative, a two-electrode capacitor whose capacitance varies in response to variations in the unidirectional bias voltage applied thereto, means coupling the two electrodes of said capacitor to the frequency-determining circuit of said oscillator, a resistance-capacitance time-constant circuit connecting said capacitor to a source of voltage in such a way that the voltage across the capacitance of said circuit provides the bias voltage for said capacitor, and means for rendering operative said oscillator and for simultaneously rendering operative said voltage source.

15. In combination, an oscillator whose frequency tends to decrease with time when said oscillator is first rendered operative, a two-electrode capacitor whose capacitance decreases in response to an increase in the unidirectional bias voltage applied thereto, means coupling the two electrodes of said capacitor to the frequency-determining circuit of said oscillator, a resistance-capacitance time-constant circuit connecting said capacitor to a source of voltage in such a way that the voltage across the capacitance of said circuit provides the bias voltage for said capacitor, and means for rendering operative said oscillator and for simultaneously rendering operative said voltage source, thereby to apply a time-varying increasing voltage to said capacitor.

References Cited in the file of this patent

UNITED STATES PATENTS

| | | |
|---|---|---|
| 2,280,527 | Kimball | Apr. 21, 1942 |
| 2,539,218 | Worcester | Jan. 23, 1951 |